US012813324B2

(12) United States Patent
Kang et al.

(10) Patent No.: US 12,813,324 B2
(45) Date of Patent: Nov. 24, 2026

(54) SEMICONDUCTOR PACKAGE AND METHOD OF FABRICATING THE SAME

(71) Applicant: Samsung Electronics Co., Ltd., Suwon-si (KR)

(72) Inventors: Jeongmin Kang, Suwon-si (KR); Jongbo Shim, Suwon-si (KR); Ji-Yong Park, Suwon-si (KR); Choongbin Yim, Suwon-si (KR); Sungeun Pyo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 409 days.

(21) Appl. No.: 18/316,682

(22) Filed: May 12, 2023

(65) Prior Publication Data

US 2024/0079285 A1 Mar. 7, 2024

(30) Foreign Application Priority Data

Sep. 1, 2022 (KR) ........................ 10-2022-0110737
Nov. 9, 2022 (KR) ........................ 10-2022-0148623

(51) Int. Cl.

| | |
|---|---|
| ***H10B 80/00*** | (2026.01) |
| ***H10W 74/01*** | (2026.01) |
| ***H10W 74/10*** | (2026.01) |
| ***H10W 90/00*** | (2026.01) |
| *H10W 74/15* | (2026.01) |

(52) U.S. Cl.

CPC .......... *H10W 74/117* (2026.01); *H10B 80/00* (2023.02); *H10W 74/01* (2026.01); *H10W 90/00* (2026.01); *H10W 74/15* (2026.01); *H10W 90/724* (2026.01); *H10W 90/734* (2026.01)

(58) Field of Classification Search

CPC .... H01L 23/3128; H10B 80/00; H10W 90/00; H10W 90/291; H10W 90/297

See application file for complete search history.

(56) References Cited

U.S. PATENT DOCUMENTS

| | | | |
|---|---|---|---|
| 8,802,499 | B2 | 8/2014 | Kelly et al. |
| 9,293,401 | B2 | 3/2016 | Yoon et al. |
| 9,953,964 | B2 | 4/2018 | Shi et al. |
| 10,014,260 | B2 | 7/2018 | Tsai et al. |
| 10,096,560 | B2 | 10/2018 | Kim et al. |

(Continued)

FOREIGN PATENT DOCUMENTS

| | | | |
|---|---|---|---|
| KR | 10-2012-0123928 | A | 11/2012 |
| KR | 1020130086441 | A | 8/2013 |

(Continued)

*Primary Examiner* — Douglas M Menz

(74) *Attorney, Agent, or Firm* — Wolf, Greenfield & Sacks, P.C.

(57) ABSTRACT

Disclosed are semiconductor packages and their fabrication methods. The semiconductor package comprises a first substrate, a first semiconductor chip on the first substrate, a molding layer on the first substrate and the first semiconductor chip and has a plurality of recesses, a plurality of substrate connection terminals on the first substrate and in the plurality of recesses, and a second semiconductor chip on the plurality of substrate connection terminals. The plurality of recesses and the plurality of substrate connection terminals are horizontally spaced apart from the first semiconductor chip. The molding layer is spaced apart from the second semiconductor chip.

16 Claims, 12 Drawing Sheets

(56) References Cited

U.S. PATENT DOCUMENTS

| | | | | |
|---|---|---|---|---|
| 10,770,364 | B2 | 9/2020 | Shi et al. | |
| 2010/0314736 | A1 | 12/2010 | Ko et al. | |
| 2011/0117700 | A1 * | 5/2011 | Weng | H01L 21/56 438/109 |
| 2011/0163391 | A1 | 7/2011 | Kinzer et al. | |
| 2014/0361387 | A1 | 12/2014 | Meyer et al. | |
| 2015/0014862 | A1 * | 1/2015 | Kwon | H01L 23/3128 257/775 |
| 2017/0243857 | A1 * | 8/2017 | Hwang | H10W 90/00 |
| 2017/0372998 | A1 | 12/2017 | Chen | |

FOREIGN PATENT DOCUMENTS

| | | | |
|---|---|---|---|
| KR | 101683688 | B1 | 12/2016 |
| KR | 101834389 | B1 | 3/2018 |
| KR | 10-2022-0006931 | A | 1/2022 |

* cited by examiner

SEMICONDUCTOR PACKAGE AND METHOD OF FABRICATING THE SAME

CROSS-REFERENCE TO RELATED APPLICATIONS

This U.S. nonprovisional application claims priority under 35 U.S.C § 119 to Korean Patent Applications No. 10-2022-0110737 filed on Sep. 1, 2022 and No. 10-2022-0148623 filed on Nov. 9, 2022 in the Korean Intellectual Property Office, the disclosures of which are hereby incorporated by reference in their entirety.

BACKGROUND

The present inventive concepts relate to a semiconductor package, and more particularly, to a semiconductor package including a semiconductor chip and a substrate that are horizontally spaced apart from each other and a method of fabricating the same.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronic industry, various studies have been conducted to improve reliability and durability of semiconductor packages.

SUMMARY

Some embodiments of the present inventive concepts provide a semiconductor package with improved structural stability.

Some embodiments of the present inventive concepts provide a semiconductor package whose productivity is increased.

The object of the present inventive concepts is not limited to the mentioned above, and other objects which have not been mentioned above will be clearly understood to those skilled in the art from the following description.

According to some embodiments of the present inventive concepts, a semiconductor package may comprise: a first substrate; a first semiconductor chip on the first substrate; a molding layer on the first substrate and the first semiconductor chip, the molding layer having a plurality of recesses; a plurality of substrate connection terminals on the first substrate and in the plurality of recesses; and a second semiconductor chip on the plurality of substrate connection terminals. The plurality of recesses and the plurality of substrate connection terminals may be horizontally spaced apart from the first semiconductor chip. The molding layer may be spaced apart from the second semiconductor chip.

According to some embodiments of the present inventive concepts, a semiconductor package may comprise a first semiconductor package and a second semiconductor package. The first semiconductor package may include: a first substrate including a first region and a second region that is horizontally spaced apart from the first region; a first semiconductor chip on the first region of the first substrate; a plurality of connection terminals between the first substrate and the first semiconductor chip; and a molding layer on the first substrate and the first semiconductor chip. The second semiconductor package may include: a plurality of substrate connection terminals on the second region of the first substrate; a second substrate on the plurality of substrate connection terminals; and a second semiconductor chip on the second substrate. The molding layer comprises a plurality of recesses that are spaced apart in a two-dimensional array on the second region of the first substrate. The plurality of substrate connection terminals may be positioned in respective ones of the plurality of recesses and electrically connect the first semiconductor package to the second semiconductor package.

According to some embodiments of the present inventive concepts, a method of fabricating semiconductor packages may comprise: forming a first semiconductor package by mounting a first semiconductor chip on a first substrate; forming on the first substrate a plurality of preliminary connection terminals horizontally spaced apart from the first semiconductor chip; forming a molding layer on the first semiconductor chip and the preliminary connection terminals; removing portions of the molding layer to form a plurality of recesses that expose the preliminary connection terminals; testing the first semiconductor chip; and mounting a second semiconductor package on the first substrate. The second semiconductor package may include preliminary substrate connection terminals connected to the preliminary connection terminals. The first semiconductor chip and the second semiconductor package may be horizontally spaced apart from each other.

DETAIL PARTED DESCRIPTION OF EMBODIMENTS

Figure 1:
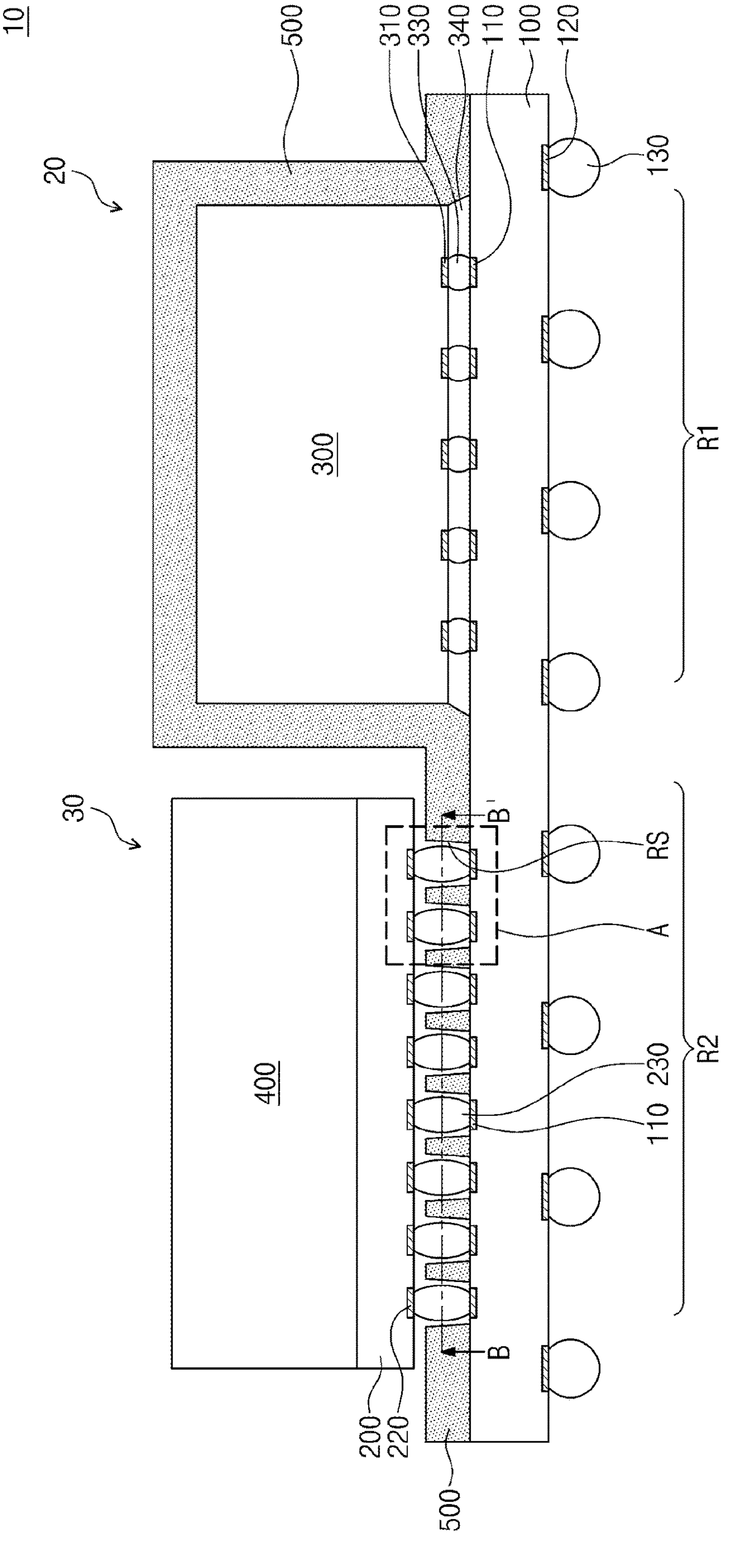
FIG. 1 illustrates a cross-sectional view showing a semiconductor package according to some embodiments of the present inventive concepts.

The following will now describe some embodiments of the present inventive concepts with reference to the accompanying drawings. Like reference numerals may indicate like components throughout the description.

Figure 2:
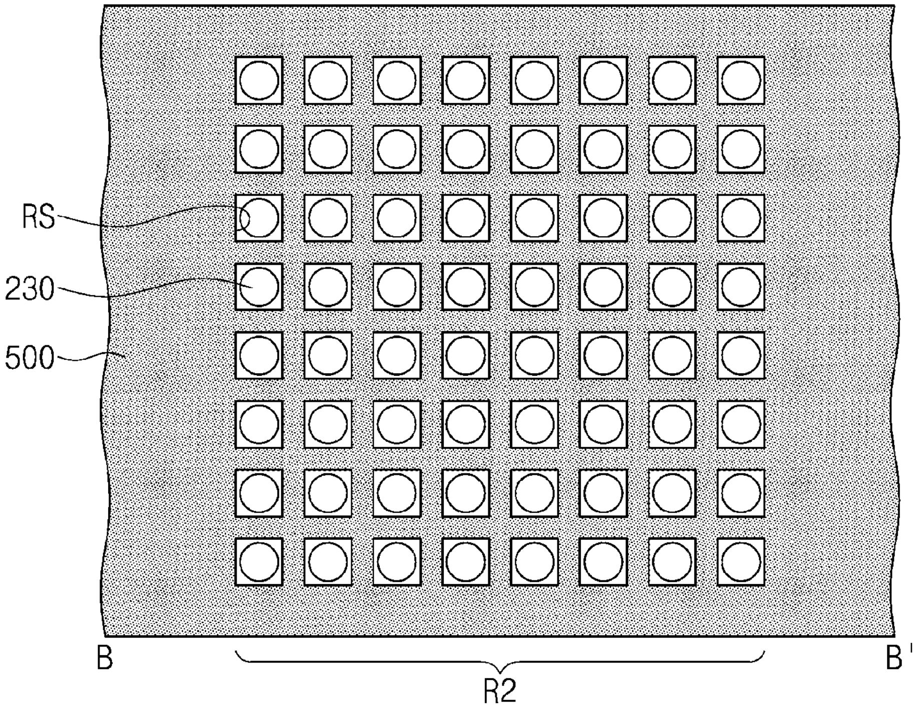
FIG. 2 illustrates a plan view taken along line B-B' of FIG. 1, partially showing a semiconductor package according to some embodiments of the present inventive concepts.

FIG. 1 illustrates a cross-sectional view showing a semiconductor package according to some embodiments of the present inventive concepts. FIG. 2 illustrates a plan view taken along line B-B' of FIG. 1, partially showing a semiconductor package according to some embodiments of the present inventive concepts.

Referring to FIG. 1, a semiconductor package 10 may include a first semiconductor package 20 and a second semiconductor package 30. The first semiconductor package 20 may include a first substrate 100, external connection terminals 130, a first semiconductor chip 300, first connection terminals 330, an underfill layer 340, and a molding layer 500.

The first substrate 100 may include a first region R1 and a second region R2. The first region R1 and the second region R2 may be horizontally spaced apart from each other. The first semiconductor chip 300 may be positioned on the first region R1 of the first substrate 100. The first substrate 100 may be provided on its second region R2 with a second semiconductor chip 400 which will be discussed below.

For example, the first substrate 100 may be a printed circuit board (PCB), a wafer, or a panel. The first substrate 100 may have a structure in which one or more dielectric layers are alternately stacked with one or more wiring layers. The first substrate 100 may have first upper substrate pads 110 on a top surface thereof. The first upper substrate pads 110 may be exposed on the top surface of the first substrate 100. The first substrate 100 may have first lower substrate pads 120 on a bottom surface thereof. The first lower substrate pads 120 may be exposed on the bottom surface of the first substrate 100. The first upper substrate pads 110 may be electrically connected to the first lower substrate pads 120 through wiring lines of the first substrate 100. The first upper substrate pads 110 and the first lower substrate pads 120 may include a metallic material, such as one or more of copper (Cu), aluminum (Al), and nickel (Ni).

The external connection terminals 130 may be on the bottom surface of the first substrate 100. The external connection terminals 130 may be horizontally spaced apart from each other. For example, the external connection terminals 130 may be on the first lower substrate pads 120 provided on the bottom surface of the first substrate 100. The external connection terminals 130 may be in contact with the first lower substrate pads 120. The external connection terminals 130 may include solder balls or solder bumps. The external connection terminals 130 may be an alloy including at least one selected from tin (Sn), silver (Ag), copper (Cu), nickel (Ni), bismuth (Bi), indium (In), antimony (Sb), and cerium (Ce). Based on type of the external connection terminals 130, the semiconductor package 10 may have a ball grid array (BGA) type, a fine ball-grid array (FBGA) type, or a land grid array (LGA) type.

The first semiconductor chip 300 may be on the first substrate 100. On the first substrate 100, the first semiconductor chip 300 may be spaced apart in a horizontal direction from a second substrate 200 which will be discussed below. The first semiconductor chip 300 may have a thickness greater than that of the second semiconductor chip 400, but the present inventive concepts are not limited thereto.

The first semiconductor chip 300 may include first chip pads 310 provided on a bottom surface thereof. The first chip pads 310 may be exposed on the bottom surface of the first semiconductor chip 300. The first chip pads 310 may include a metallic material, such as one or more of copper (Cu), aluminum (Al), and nickel (Ni).

The first semiconductor chip 300 may be flip-chip mounted on the first substrate 100. The first connection terminals 330 may be provided between the first semiconductor chip 300 and the first substrate 100. The positions of the first connection terminals 330 may correspond to the first chip pads 310 of the first semiconductor chip 300 and to the first upper substrate pads 110 of the first substrate 100. The first semiconductor chip 300 may be mounted through the first connection terminals 330 on the first substrate 100. The first semiconductor chip 300 and the second substrate 200 may be electrically connected to each other through the first substrate 100.

The first connection terminals 330 may include solder balls or solder bumps. The first connection terminals 330 may be an alloy including at least one selected from tin (Sn), silver (Ag), copper (Cu), nickel (Ni), bismuth (Bi), indium (In), antimony (Sb), and cerium (Ce).

The first semiconductor chip 300 may include a logic chip. For example, the logic chip may include one or more of an application specific integrated circuit (ASIC) chip, an application processor (AP) chip, a central processing unit (CPU), and a graphic processing unit (GPU). The ASIC chip may include an application specific integrated circuit (ASIC).

The underfill layer 340 may be provided between the first semiconductor chip 300 and the first substrate 100. The underfill layer 340 may have inclined lateral surfaces, but the present inventive concepts are not limited thereto. The underfill layer 340 may be on side surfaces of the first connection terminals 330, e.g., to surround the first connection terminals 330 between the first semiconductor chip 300 and the first substrate 100. For example, the underfill layer 340 may be in or fill a space between the first connection terminals 330.

The second semiconductor package 30 may be provided on the second region R2 of the first substrate 100. The second semiconductor package 30 may include a second substrate 200, substrate connection terminals 230, and a second semiconductor chip 400.

Likewise, the first substrate 100, the second substrate 200 may have a structure in which one or more dielectric layers are alternately stacked with one or more wiring layers. Alternatively, the second substrate 200 may include a through electrode that extends into or penetrates the second substrate 200. The second substrate 200 may have second lower substrate pads 220 on a bottom surface thereof. The second lower substrate pads 220 may be exposed on the bottom surface of the second substrate 200. The second lower substrate pads 220 may include a metallic material, such as one or more of copper (Cu), aluminum (Al), and nickel (Ni).

The second substrate 200 may be flip-chip mounted on the first substrate 100. The first substrate 100 and the second substrate 200 may be provided therebetween with substrate connection terminals 230. The positions of the substrate connection terminals 230 may correspond to the second lower substrate pads 220 of the second substrate 200 and to the first upper substrate pads 110 of the first substrate 100. For example, each of the substrate connection terminals 230 may be coupled to one of the second lower substrate pads 220 and a corresponding one of the first upper substrate pads 110. The second substrate 200 may be mounted through the substrate connection terminals 230 on the first substrate 100. The second substrate 200 and the first substrate 100 may be electrically connected to each other through the substrate connection terminals 230. For example, the substrate connection terminals 230 may include solder balls or solder bumps. The substrate connection terminals 230 may be an alloy including at least one selected from tin (Sn), silver (Ag), copper (Cu), nickel (Ni), bismuth (Bi), indium (In), antimony (Sb), and cerium (Ce).

The second semiconductor chip 400 may be provided on the second substrate 200. On the second substrate 200, the second semiconductor chip 400 may be spaced apart in the horizontal direction from the first semiconductor chip 300. The second semiconductor chip 400 may be electrically connected to the second substrate 200. Therefore, the second semiconductor chip 400 may be electrically connected to the first semiconductor chip 300 through the first substrate 100 and the second substrate 200.

The second semiconductor chip 400 may be a memory chip. For example, the memory chip may include a dynamic random access memory (DRAM).

Referring to FIGS. 1 and 2, the molding layer 500 may cover the first substrate 100 and the first semiconductor chip 300 of the first semiconductor package 20. For example, the molding layer 500 may be provided on top and lateral surfaces of the first semiconductor chip 300. The molding layer 500 may be provided on the lateral surfaces of the underfill layer 340. The molding layer 500 may be provided on the top surface of the first substrate 100.

The molding layer 500 may provide recesses RS on the second region R2 of the first substrate 100. For example, the recesses RS of the molding layer 500 may be positioned between the first substrate 100 and the second substrate 200. When viewed in plan, the recesses RS may be spaced apart in a two-dimensional array (e.g., the recesses RS may be two-dimensionally arranged while being spaced apart from each other). One of the substrate connection terminals 230 may be positioned in a corresponding recess RS. For example, portions of the molding layer 500 may be provided between the substrate connection terminals 230.

The molding layer 500 covering the first semiconductor chip 300 may be spaced apart in the horizontal direction from the second semiconductor package 30. On the second region R2, the molding layer 500 covering the top surface of the first substrate 100 may be spaced apart in the vertical direction from the second semiconductor package 30. For example, the second semiconductor package 30 may be spaced apart from and not be in contact with the molding layer 500. The molding layer 500 may include an epoxy molding compound (EMC).

When the first semiconductor chip 300 is tested in a semiconductor package fabrication method, which will be discussed below, the molding layer 500 provided on the first substrate 100 may prevent warpage of the first substrate 100 and thus the semiconductor package 10 may increase in structural stability. For example, when a force is applied to an outer portion of the first substrate 100, the molding layer 500 may prevent warpage of a central portion of the first substrate 100.

Figure 3:
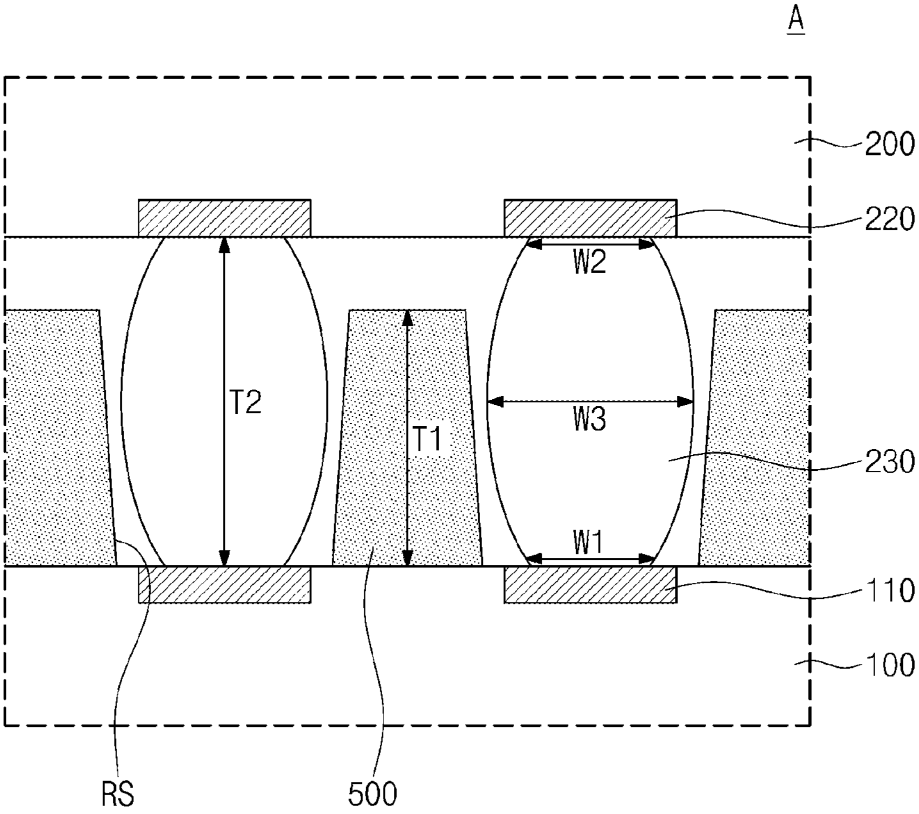
FIGS. 3 and 4 illustrate enlarged views of section A depicted in FIG. 1, partially showing a semiconductor package according to some embodiments of the present inventive concepts.
Figure 4:
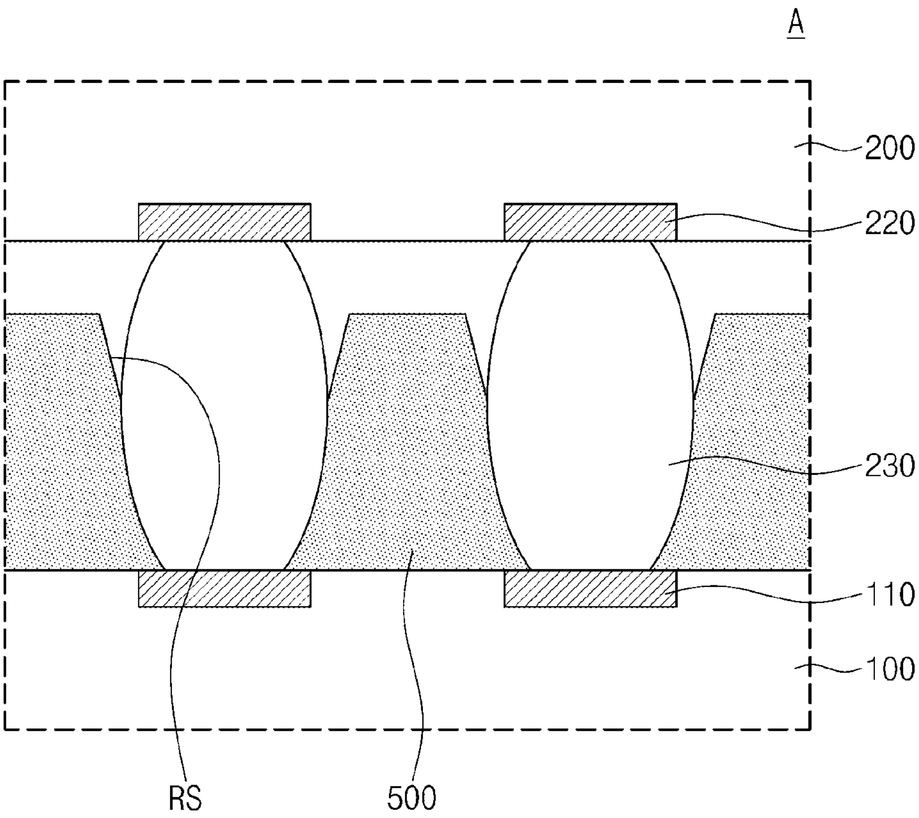

FIGS. 3 and 4 illustrate enlarged views of section A depicted in FIG. 1, partially showing a semiconductor package according to some embodiments of the present inventive concepts.

In the following, a description of components the same as those discussed with reference to FIG. 1 will be omitted, and a difference thereof will be discussed in detail.

Referring to FIG. 3, the first substrate 100 may include the first upper substrate pads 110, and the second substrate 200 may include the second lower substrate pads 220. The substrate connection terminals 230 and a portion of the molding layer 500 that provides the recesses RS may be provided between the first substrate 100 and the second substrate 200.

The molding layer 500 on the first substrate 100 may have a first thickness T1 in a vertical direction. To prevent warpage of the first substrate 100, the first thickness T1 of the molding layer 500 may be equal to or greater than a certain value. For example, the first thickness T1 may range from about 50 μm to about 150 μm. The molding layer 500 may have a portion between the substrate connection terminals 230, and the portion of the molding layer 500 may have a minimum width at a top surface thereof and a maximum width at a bottom surface thereof. For example, the molding layer 500 between the substrate connection terminals 230 may have a width that increases in a direction from top to bottom surfaces of the molding layer 500. Thus, the portion of the molding layer 500 between the substrate connection terminals 230 has a width that decreases in a direction from bottom to top surfaces of the portion of the molding layer 500. The present inventive concepts, however, are not limited thereto, and the molding layer 500 between the substrate connection terminals 230 may have a constant width between top and bottom surfaces of the molding layer 500.

Each of the substrate connection terminals 230 may be positioned between the second substrate 200 and the first substrate 100, and may be in contact with the second lower substrate pad 220 and the first upper substrate pad 110. In addition, each of the substrate connection terminals 230 may be positioned in the recess RS of the molding layer 500 and spaced apart in the horizontal direction from the molding layer 500. Therefore, the top surface of the first substrate 100 may be partially exposed outwardly.

The substrate connection terminals 230 may each have a second thickness T2 in a vertical direction. The second thickness T2 may be greater than the first thickness T1. For this reason, the top surface of the molding layer 500 may not be in contact with a bottom surface of the second substrate 200.

For another example, the second thickness T2 may be substantially the same as the first thickness T1. In this case, the top surface of the molding layer 500 may be in contact with the bottom surface of the second substrate 200.

The substrate connection terminals 230 may each have a first width W1 at a bottom surface thereof. The substrate connection terminals 230 may each have a second width W2 at a top surface thereof. The first width W1 may be substantially the same as the second width W2. The substrate connection terminals 230 may each have a third width W3 at a center thereof. The third width W3 may be greater than the first width W1 and the second width W2. For example, the substrate connection terminals 230 may each have a width that has a maximum at the center of the substrate connection terminal 230.

Referring to FIG. 4, differently from FIG. 3, a portion of the molding layer 500 may be in contact with a portion of the substrate connection terminal 230. The molding layer 500 and the substrate connection terminals 230 may cause the first substrate 100 to have its top surface that is not outwardly exposed. This structural difference may depend on a difference in laser irradiation duration, laser beam width, and/or laser intensity in a semiconductor package fabrication method which will be discussed below. For example, the laser irradiation duration of FIG. 4 may be shorter than that of FIG. 3.

Figure 5:
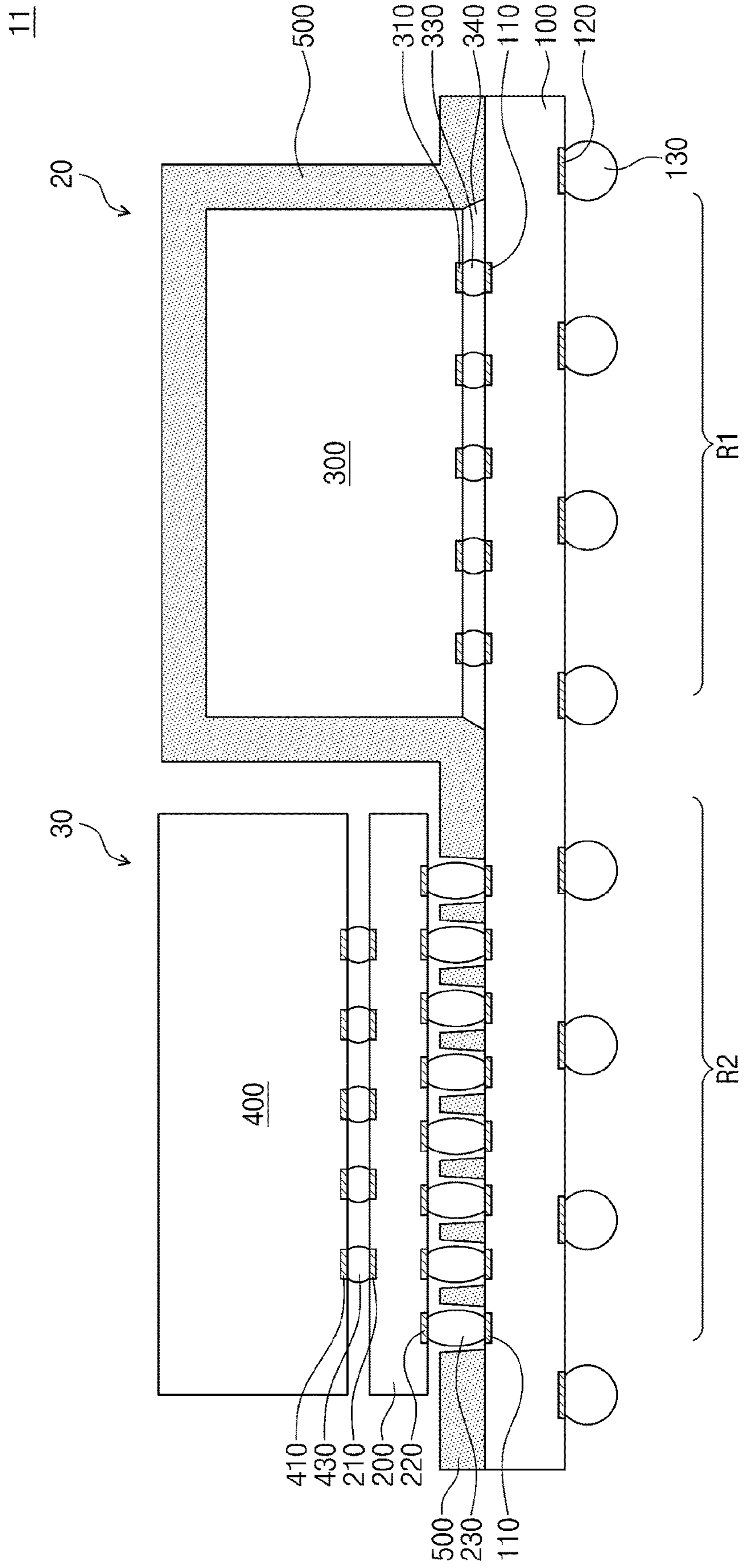
FIGS. 5 and 6 illustrate cross-sectional views showing a semiconductor package according to some embodiments of the present inventive concepts.
Figure 6:
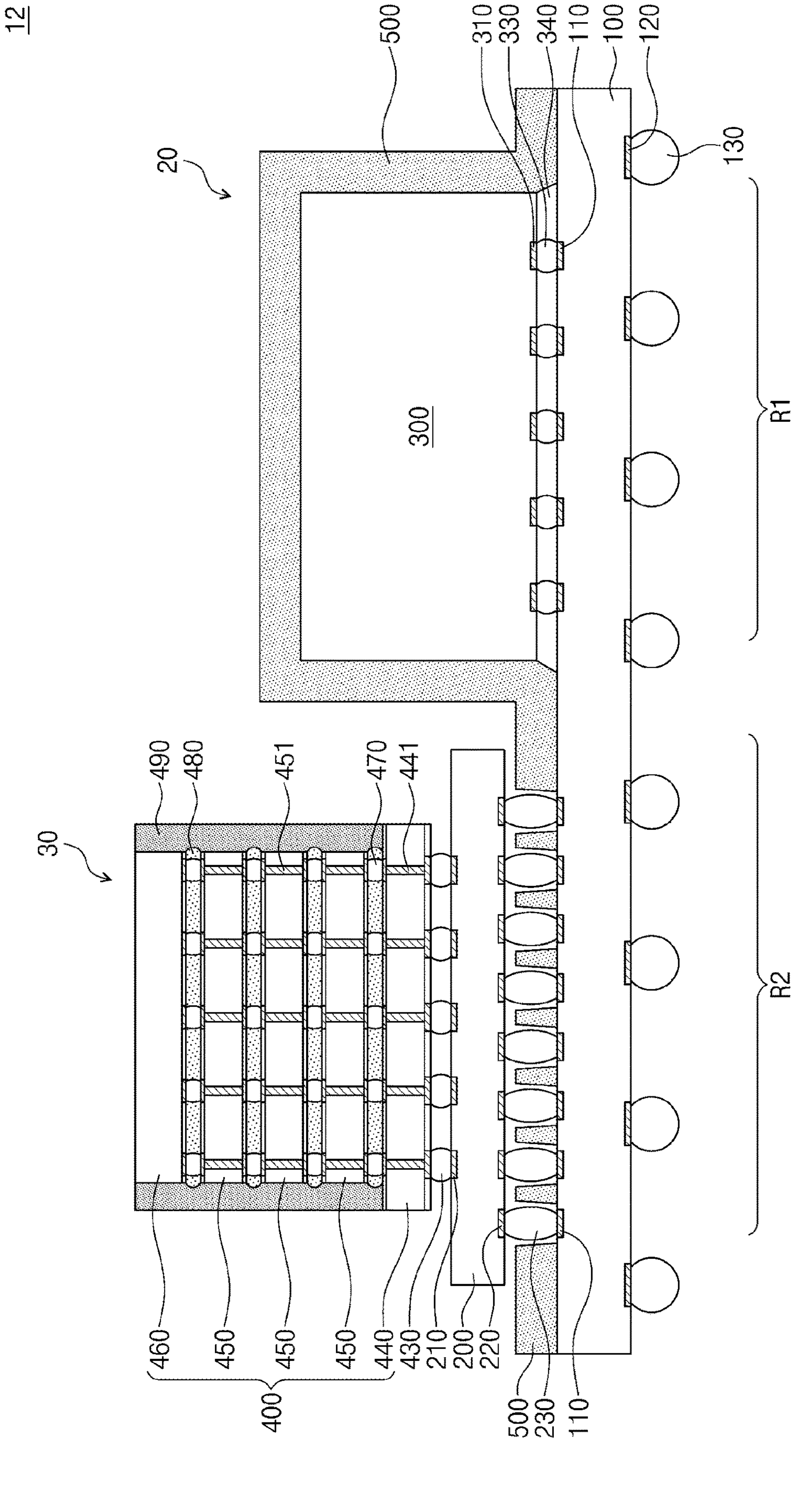

FIGS. 5 and 6 illustrate cross-sectional views showing a semiconductor package according to some embodiments of the present inventive concepts.

In the following, a description of components the same as those discussed with reference to FIG. 1 will be omitted, and a difference thereof will be discussed in detail.

Referring to FIG. 5, a semiconductor package 11 may include a first semiconductor package 20 and a second semiconductor package 30. The second semiconductor chip 400 may include second chip pads 410 provided on a bottom surface thereof. The second chip pads 410 may be exposed on the bottom surface of the second semiconductor chip 400. The second chip pads 410 may include a metallic material, such as one or more of copper (Cu), aluminum (Al), and nickel (Ni).

The second semiconductor package 30 may further include second connection terminals 430. The second connection terminals 430 may electrically connect the second substrate 200 to the second semiconductor chip 400.

The second substrate 200 may further include second upper substrate pads 210. The second upper substrate pads 210 may be on a top surface of the second substrate 200. The second upper substrate pads 210 may be exposed on the top surface of the second substrate 200. The second upper substrate pads 210 may be electrically connected to the second lower substrate pads 220 through wiring lines or through electrodes of the second substrate 200. The second upper substrate pads 210 may include a metallic material, such as one or more of copper (Cu), aluminum (Al), and nickel (Ni).

The second semiconductor chip 400 may be flip-chip mounted on the second substrate 200. The second semiconductor chip 400 and the second substrate 200 may be provided with second connection terminals 430 therebetween. The second connection terminals 430 may be on the bottom surface of the second semiconductor chip 400. The positions of the second connection terminals 430 may correspond to the second chip pads 410 of the second semiconductor chip 400 and to the second upper substrate pads 210 of the second substrate 200.

Each of the second connection terminals 430 may be coupled to one of the second chip pads 410 and its corresponding one of the second upper substrate pads 210. The second semiconductor chip 400 may be mounted through the second connection terminals 430 on the second substrate 200. The second connection terminals 430 may include solder balls or solder bumps. The second connection terminals 430 may be an alloy including at least one selected from tin (Sn), silver (Ag), copper (Cu), nickel (Ni), bismuth (Bi), indium (In), antimony (Sb), and cerium (Ce). Although not shown, a dielectric material may be in a space between the second semiconductor chip 400 and the second substrate 200 and may fill the space between the second semiconductor chip 400 and the second substrate 200 and be on a side surface of the second connection terminals 430 (e.g., to surround the second connection terminals 430).

Alternatively, the second semiconductor chip 400 may be electrically connected through one or more bonding wires to the second substrate 200. In this case, the second chip pads 410 may be provided on a top surface of the second semiconductor chip 400. The second chip pads 410 may be exposed on the top surface of the second semiconductor chip 400. The second semiconductor chip 400 may have a size less than that of the second substrate 200.

Referring to FIG. 6, a semiconductor package 12 may include a first semiconductor package 20 and a second semiconductor package 30. The second semiconductor package 30 may include a second semiconductor chip 400 having a chip stack structure or the second semiconductor chip 400 may be provided as a part of a stack or stack structure of a plurality of semiconductor chips. The chip stack structure may be a structure in which a plurality of semiconductor chips 440, 450, and 460 and non-conductive layers 480 are stacked in the vertical direction.

The second semiconductor chip 400 may include a base semiconductor chip 440, lower semiconductor chips 450, and an upper semiconductor chip 460. The lower semiconductor chips 450 and the upper semiconductor chip 460 may be sequentially stacked on the base semiconductor chip 440. The base semiconductor chip 440 may have a width greater than that of the upper semiconductor chip 460 and those of the lower semiconductor chips 450. The upper semiconductor chip 460 and the lower semiconductor chips 450 may have substantially the same width. The base semiconductor chip 440 may include a logic chip, a controller chip, or a buffer chip. The upper semiconductor chip 460 and the lower semiconductor chips 450 may be of different types from the base semiconductor chip 440. The upper semiconductor chip 460 and the lower semiconductor chips 450 may include a memory chip.

The base semiconductor chip 440 may include first upper chip pads, first lower chip pads, and first through electrodes 441. The first lower chip pads may be provided on a bottom surface of the base semiconductor chip 440. The first upper chip pads may be provided on a top surface of the base semiconductor chip 440. The first upper chip pads and the first lower chip pads may include a metallic material, such as one or more of copper (Cu), aluminum (Al), and nickel (Ni).

The first through electrodes 441 may be provided in the base semiconductor chip 440. The first through electrodes 441 may vertically extend into or penetrate the base semiconductor chip 440. The first through electrodes 441 may be spaced apart from each other in the horizontal direction. The first through electrodes 441 may be coupled to corresponding ones of the first upper chip pads and the first lower chip pads. The first through electrodes 441 may include a metallic material, such as one or more of copper (Cu), titanium (Ti), tungsten (W), and a combination thereof.

The lower semiconductor chips 450 may be stacked on the base semiconductor chip 610 in a direction perpendicular to the top surface of the base semiconductor chip 440. The following will describe a configuration of one of the lower semiconductor chips 450.

The lower semiconductor chip 450 may include second upper chip pads, second lower chip pads, and second through electrodes 451. The second lower chip pads may be provided on a bottom surface of the lower semiconductor chip 450. The second upper chip pads may be provided on a top surface of the lower semiconductor chip 450. The second upper chip pads and the second lower chip pads may include a metallic material, such as one or more of copper (Cu), aluminum (Al), and nickel (Ni).

The second through electrodes 451 may be provided in the lower semiconductor chip 450. The second through electrode 451 may vertically extend into or penetrate the lower semiconductor chip 450. The second through electrodes 451 may be spaced apart from each other in the horizontal direction. The second through electrodes 451 may be coupled to corresponding ones of the second upper chip pads and the second lower chip pads. The second through electrodes 451 may include a metallic material, such as one or more of copper (Cu), titanium (Ti), tungsten (W), and a combination thereof.

The upper semiconductor chip 460 may be on the lower semiconductor chips 450. The upper semiconductor chip 460 may be a semiconductor chip at top of the second semiconductor chip 400. The upper semiconductor chip 460 may be provided with third lower chip pads on a bottom surface thereof.

Chip connection terminals 470 may be provided between the base semiconductor chip 440, the lower semiconductor chips 450, and the upper semiconductor chip 460. The chip connection terminals 470 may be between corresponding ones of the first upper chip pads, the second upper chip pads, the second lower chip pads, and the third lower chip pads. The chip connection terminals 470 may electrically connect to each other the base semiconductor chip 440, the lower semiconductor chips 450, and the upper semiconductor chip 460.

The non-conductive layers 480 may fill spaces between the base semiconductor chip 440, the lower semiconductor chips 450, and the upper semiconductor chip 460. The non-conductive layers 480 may be on a side surface of the chip connection terminals 470 (e.g., to surround the chip connection terminals 470) between the base semiconductor chip 440, the lower semiconductor chips 450, and the upper semiconductor chip 460. The non-conductive layers 480 may protrude from a lateral surface of the upper semiconductor chip 460 and lateral surfaces of the lower semiconductor chips 450. The non-conductive layers 480 may include a non-conductive film (NCF) or a non-conductive paste (NCP). The non-conductive layers 480 may include a dielectric polymer.

The base semiconductor chip 440 may be provided thereon with a chip stack molding layer 490 that is on side surfaces of (e.g., surrounds) the upper semiconductor chip 460, the lower semiconductor chips 450, and the non-conductive layers 480. The chip stack molding layer 490 may have a lateral surface vertically aligned with that of the base semiconductor chip 440. The chip stack molding layer 490 may expose a top surface of the upper semiconductor chip 460. A top surface of the chip stack molding layers 490 may be coplanar with the top surface of the upper semiconductor chip 460. Alternatively, the chip stack molding layer 490 may cover the top surface of the upper semiconductor chip 460. For example, the chip stack molding layer 490 may include an epoxy molding compound (EMC).

The second semiconductor chip 400 may include high bandwidth memory (HBM) chips. No limitation is imposed on the number of the semiconductor chips 450 and 460 stacked on the base semiconductor chip 440. An increase in storage capacity may be achieved by an increase in the number of the semiconductor chips 450 and 460 stacked on the base semiconductor chip 440.

Figure 7:
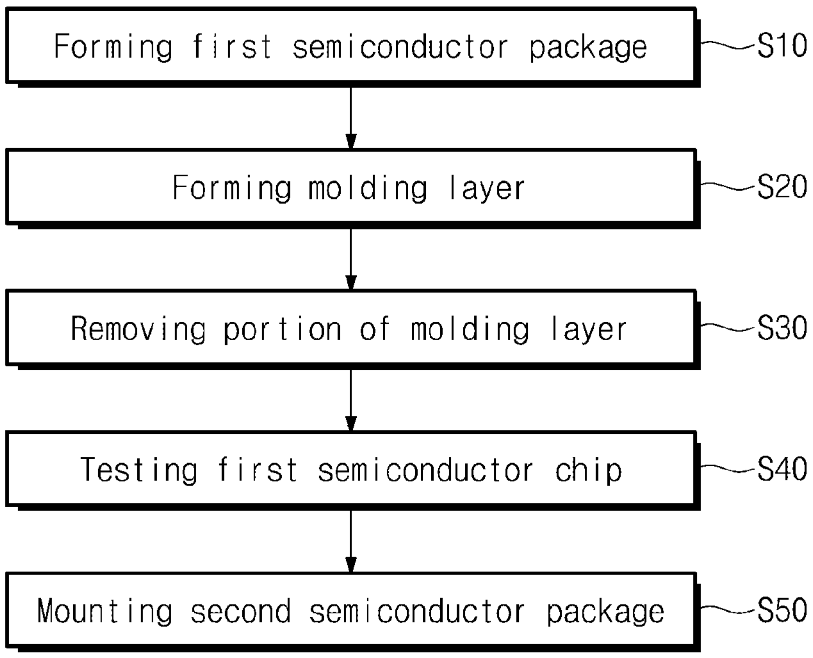
FIG. 7 illustrates a flow chart showing a method of fabricating a semiconductor package according to some embodiments of the present inventive concepts.

FIG. 7 illustrates a flow chart showing a method of fabricating a semiconductor package according to some embodiments of the present inventive concepts. FIGS. 8 to 12 illustrate cross-sectional views showing a semiconductor package according to exemplary embodiments of inventive concepts.

Referring to FIG. 7, a method of fabricating a first semiconductor package may include forming a first semiconductor package (S10), forming a molding layer (S20), removing a portion of the molding layer to form recesses (S30), testing a first semiconductor chip (S40), and mounting a second semiconductor chip (S50).

Figure 8:
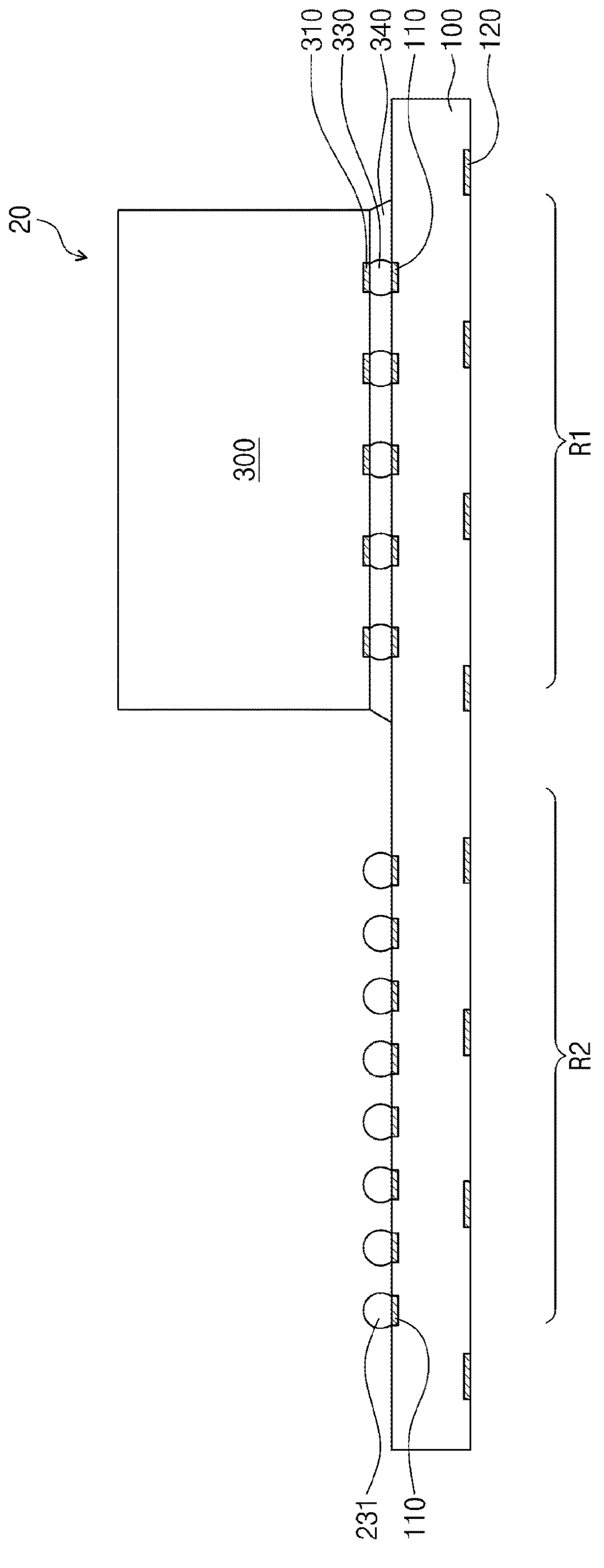
FIGS. 8 to 12 illustrate cross-sectional views showing a method of fabricating a semiconductor package according to some embodiments of the present inventive concepts.

Referring to FIGS. 7 and 8, the step of forming a first semiconductor package (S10) may include mounting a first semiconductor chip 300 on a first substrate 100, forming an underfill layer 340, and forming preliminary connection terminals 231 on the first substrate 100.

The first substrate 100 may be provided. The first semiconductor chip 300 may be provided on a first region R1 of the first substrate 100. The first semiconductor chip 300 may be flip-chip mounted on the first substrate 100. The first semiconductor chip 300 may be mounted through first connection terminals 330 on the first substrate 100.

For example, the first connection terminals 330 may be provided on first chip pads 310 of the first semiconductor chip 300, and then the first semiconductor chip 300 may be on the first substrate 100 to allow the first connection terminals 330 to align with first upper substrate pads 110. Afterwards, the first connection terminals 330 may undergo a reflow process to allow the first connection terminals 330 to connect with the first chip pads 310 and the first upper substrate pads 110.

After the first semiconductor chip 300 is mounted on the first substrate 100, an underfill layer 340 may be formed on side surfaces of the first connection terminals 330, e.g., to surround the first connection terminals 330. The underfill layer 340 may prevent an electrical short between the first connection terminals 330 and to increase structural stability of a semiconductor package.

Thereafter, the preliminary connection terminals 231 may be formed on a second region R2 of the first substrate 100. The preliminary connection terminals 231 may be spaced apart from each other in a horizontal direction. For example, each of the preliminary connection terminals 231 may be formed on the first upper substrate pad 110 on the second region R2 of the first substrate 100. Alternatively, the preliminary connection terminals 231 may be formed simultaneously with the first connection terminals 330 discussed above.

Figure 9:
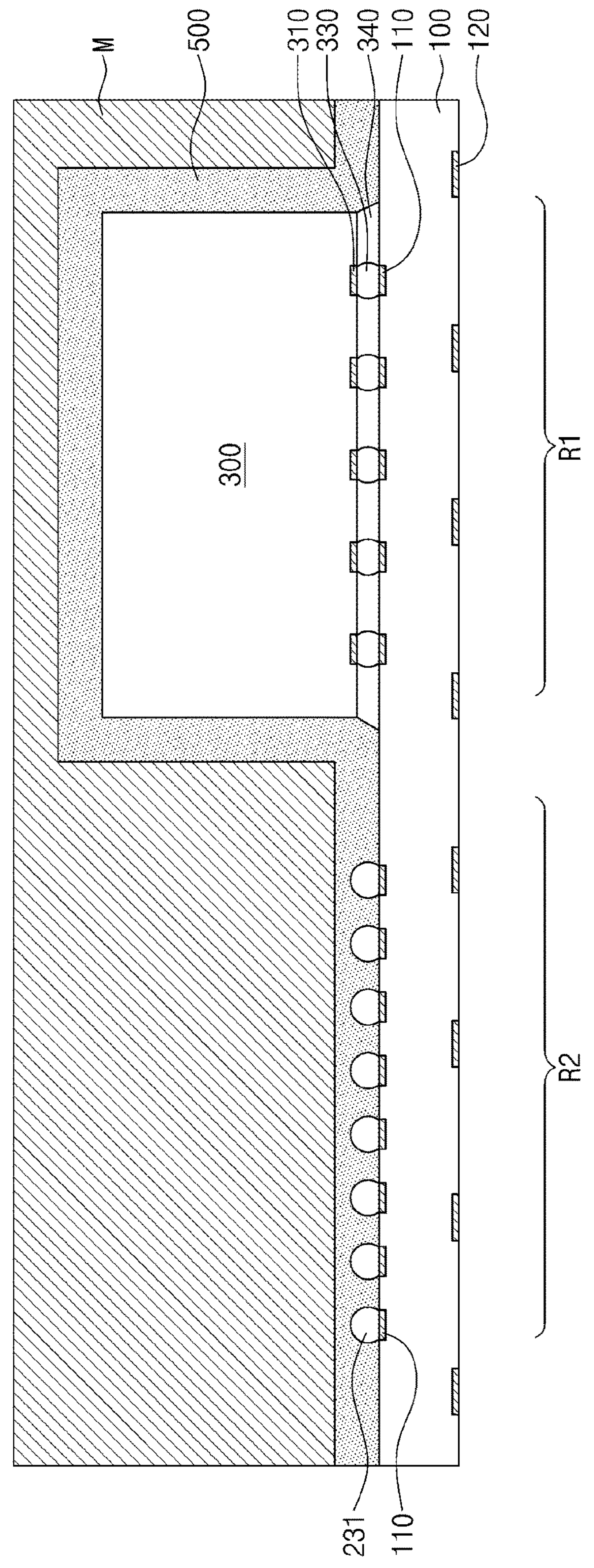

Referring to FIGS. 7 and 9, the step of forming a molding layer (S20) may include positioning a mold M on the first substrate 100, injecting a molding material, and removing the mold M.

The mold M may be positioned on the first substrate 100. The mold M may be spaced apart in a vertical direction from the first substrate 100, the preliminary connection terminals 231, and the first semiconductor chip 300. For example, an inner space may be provided between the mold M and each of the first substrate 100, the preliminary connection terminals 231, and the first semiconductor chip 300.

After that, a molding material may be injected to the inner space. The molding material may be positioned between the mold M and each of the first substrate 100, the preliminary connection terminals 231, and the first semiconductor chip 300. The molding material may include an epoxy molding compound (EMC).

Afterwards, the mold M may be removed. The removal of the mold M may form a molding layer 500 that covers the preliminary connection terminals 231 and the first semiconductor chip 300 on the first substrate 100. The molding layer 500 may cover top and lateral surfaces of the first semiconductor chip 300, lateral surfaces of the underfill layer 340, a top surface of the first substrate 100, and the preliminary connection terminals 231. The molding layer 500 may not outwardly expose the preliminary connection terminals 231. The molding layer 500 may cover the first substrate 100 and components on the first substrate 100, and thus the first substrate 100 may be prevented from warpage. As a result, a semiconductor package may increase in structural stability.

Figure 10:
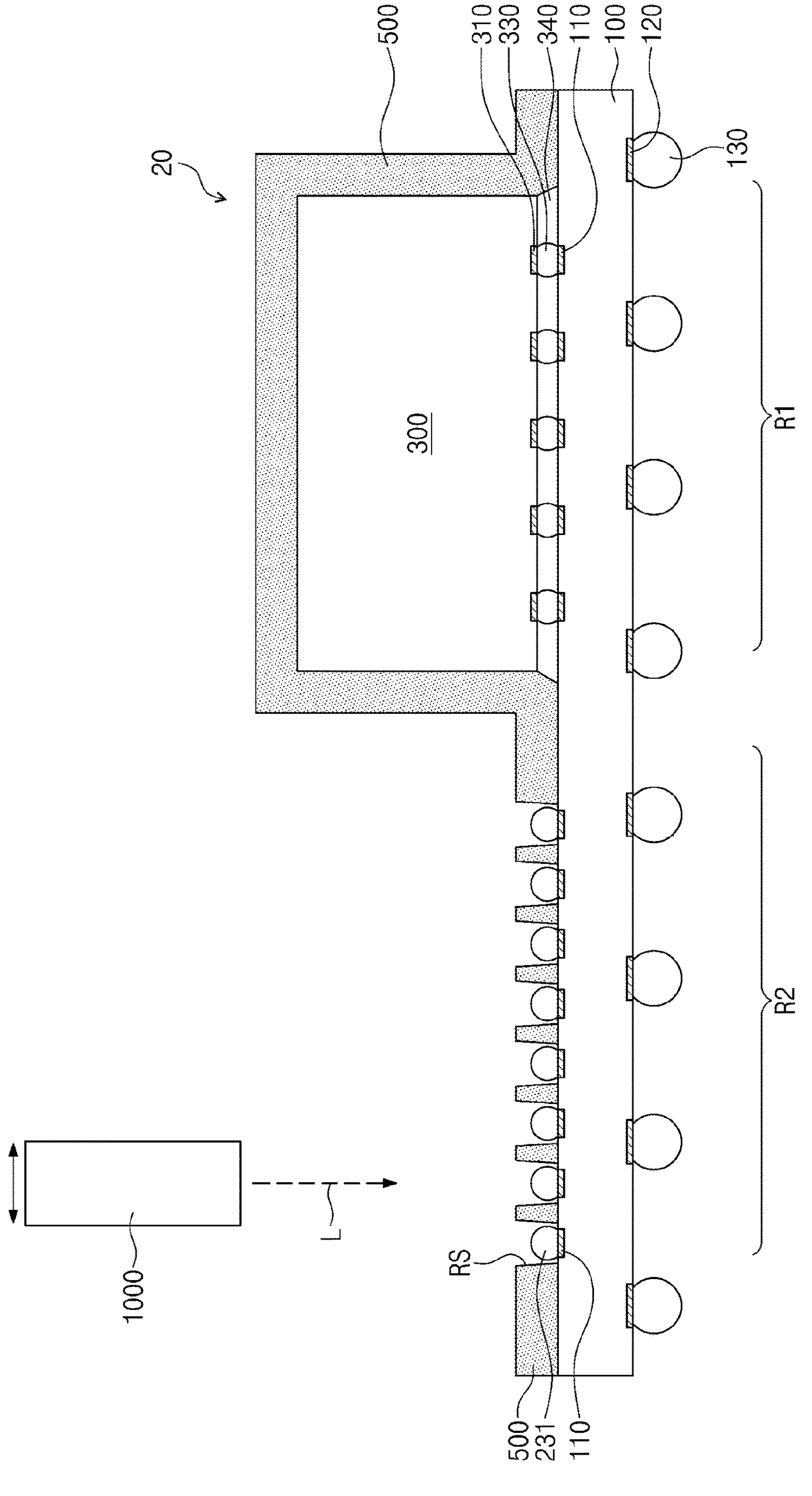

Referring to FIGS. 7 and 10, the molding layer 500 may be partially removed to form recesses RS that outwardly expose the preliminary connection terminals 231. The partial removal of the molding layer 500 may be achieved by a laser drill process.

For example, a laser irradiation apparatus 1000 may move in the horizontal direction on the second region R2 of the first substrate 100. The laser irradiation apparatus 1000 may irradiate a laser L while positioning on the preliminary connection terminals 231. The laser L may remove a portion of the molding layer 500 on the preliminary connection terminals 231. Thus, at least a portion of the preliminary connection terminal 231 may be outwardly exposed. For example, portions of the molding layer 500 around the preliminary connection terminals 231 may form the recesses RS that expose the preliminary connection terminals 231.

A depth and/or shape of the recess RS may depend on one or more of a running time of the laser drill process, a laser beam width, and laser intensity. For example, when the running time of the laser drill process is long, the laser beam width is wide, or the laser intensity is high, the molding layer 500 between the substrate connection terminals 230 may be spaced apart in the horizontal direction from the substrate connection terminals 230 as shown in FIG. 3. For another example, when the running time of the laser drill process is short, the laser beam width is narrow, or the laser intensity is low, the molding layer 500 between the substrate connection terminals 230 may be in partial contact with the substrate connection terminals 230 as shown in FIG. 4. The laser L may have a wavelength ranging from about 900 nm to about 1,700 nm, but the present inventive concepts are not limited.

Alternatively, the partial removal of the molding layer 500 may be performed by a sawing process that uses a blade, a wet etching process, or a dry etching process other than the laser drill process.

Afterwards, external connection terminals 130 may further be formed. The external connection terminals 130 may be formed on a bottom surface of the first substrate 100. For example, the external connection terminals 130 may be formed on the first lower substrate pads 120 of the first substrate 100. A semiconductor package may be electrically connected through the external connection terminals 130 to a semiconductor package tester or an external electronic device.

After the formation of the external connection terminals 130, the step of testing a first semiconductor chip (S40) may be performed. As the molding layer 500 covers the top surface of the first substrate 100 on the second region R2 of the first substrate 100, the first substrate 100 may be prevented from warpage. Therefore, before mounting a second semiconductor package 30 which will be discussed below, the first semiconductor chip 300 may be test. In this sense, it may be possible to ascertain whether the first semiconductor chip 300 is defective or not in an intermediate stage in fabricating a semiconductor package, and accordingly to avoid unnecessary loss of the second semiconductor package 30.

Figure 11:
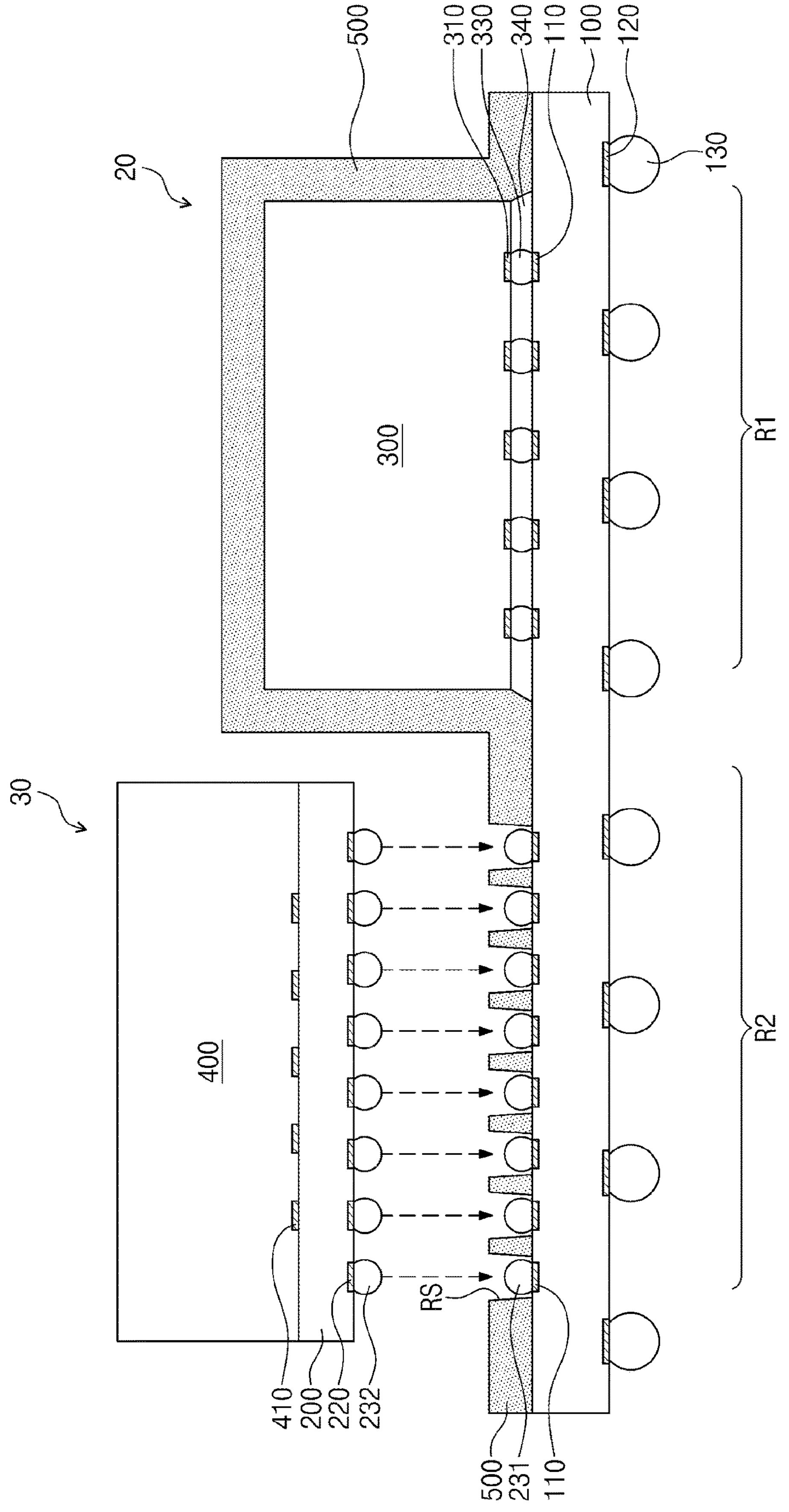
Figure 12:
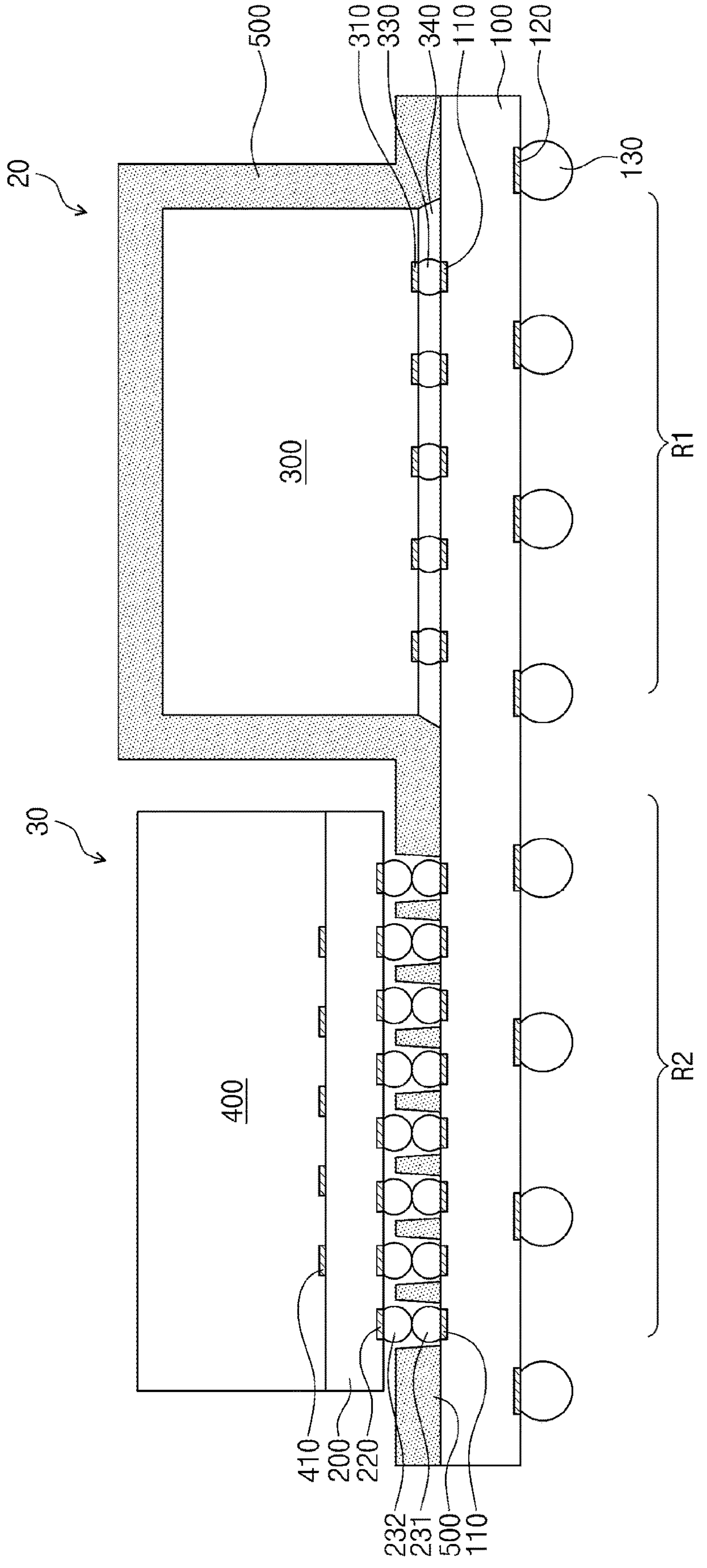

Referring to FIGS. 7, 11, and 12, the step of mounting a second semiconductor package (S50) may include aligning a second semiconductor package 30 to with the first substrate 100, and connecting the preliminary connection terminals 231 to preliminary substrate connection terminals 232 (e.g., combining the preliminary connection terminals 231 with the preliminary substrate connection terminals 232).

The molding layer 500 on the second region R2 of the first substrate 100 may have a thickness (see T1 of FIG. 5) greater than those of the preliminary connection terminals 231. Therefore, certain spaces may be provided in the recesses RS of the molding layer 500. When the second semiconductor package 30 descends in the vertical direction on the second region R2 of the first substrate 100, the spaces may correspondingly receive the preliminary substrate connection terminals 232 of the second semiconductor package 30. For example, the preliminary substrate connection terminals 232 may be positioned in corresponding recesses RS. The molding layer 500 may suppress the preliminary substrate connection terminals 232 from moving in the horizontal direction. Thus, the preliminary substrate connection terminals 232 may be exactly positioned on corresponding preliminary connection terminals 231. In such cases, the second semiconductor package 30 may be aligned with the first substrate 100 through the recesses RS of the molding layer 500.

Afterwards, a reflow process may be performed to mount the second semiconductor package 30 on the first substrate 100. For example, the reflow process may cause the preliminary connection terminals 231 and the preliminary substrate connection terminals 232 to have their solid states with viscosity. The preliminary connection terminal 231 and the preliminary substrate connection terminal 232 may be connected into a single unitary body. For example, the preliminary connection terminals 231 and the preliminary substrate connection terminals 232 may be connected into substrate connection terminals 230 of FIG. 1. The second semiconductor package 30 may be electrically connected thorough the substrate connection terminals 230 to the first substrate 100.

A semiconductor package according to some embodiments of the present inventive concepts may include a first substrate, a first semiconductor chip, and a molding layer that covers the first substrate and the first semiconductor chip. The molding layer may prevent warpage of the first substrate, and thus the semiconductor package may increase in structural stability.

In a method of fabricating a semiconductor package according to some embodiments of the present inventive concepts, a first semiconductor package may be formed, and the first semiconductor package may be tested before a second package may be mounted. Accordingly, it may be possible to prevent the second semiconductor package from unnecessary loss caused by failure of a first semiconductor chip.

Although the present invention has been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A semiconductor package, comprising:

a first substrate;

a first semiconductor chip on the first substrate;

a molding layer on the first substrate and the first semiconductor chip, the molding layer having a plurality of recesses;

a plurality of substrate connection terminals on the first substrate and in the plurality of recesses; and a second semiconductor chip on the plurality of substrate connection terminals, wherein the plurality of recesses and the plurality of substrate connection terminals are horizontally spaced apart from the first semiconductor chip, wherein the molding layer is spaced apart from the second semiconductor chip, wherein the second semiconductor chip is spaced apart in a horizontal direction from the first semiconductor chip, wherein the molding layer contacts a top surface of the first semiconductor chip and is arranged under a bottom surface of the second semiconductor chip, wherein the molding layer comprises:

a first portion outside of the plurality of recesses that is adjacent to and laterally offset from the second semiconductor chip; and a second portion between the plurality of recesses, and wherein a thickness of the first portion is equal to a thickness of the second portion.

2. The semiconductor package of claim 1, wherein the plurality of recesses are arranged in a two-dimensional array.

3. The semiconductor package of claim 1, further comprising a second substrate between the second semiconductor chip and the plurality of substrate connection terminals.

4. The semiconductor package of claim 3, further comprising a plurality of connection terminals between the second substrate and the second semiconductor chip.

5. The semiconductor package of claim 1, wherein the second semiconductor chip is a part of a stack comprising a plurality of semiconductor chips.

6. The semiconductor package of claim 1, wherein a portion of the molding layer between ones of the plurality of substrate connection terminals has a width that decreases in a direction from bottom to top surfaces of the portion of the molding layer.

7. The semiconductor package of claim 1, wherein:

the first semiconductor chip includes a logic chip, and the second semiconductor chip includes a memory chip.

8. The semiconductor package of claim 1, wherein a portion of the molding layer between ones of the plurality of substrate connection terminals has a thickness of 50 μm to 150 μm.

9. The semiconductor package of claim 1, wherein the plurality of substrate connection terminals are spaced apart from the molding layer.

10. The semiconductor package of claim 1, wherein at least portions of the plurality of substrate connection terminals are in contact with the molding layer.

11. The semiconductor package of claim 1, wherein a thickness of each of the plurality of substrate connection terminals is greater than a thickness of the molding layer.

12. The semiconductor package of claim 1, wherein a width of each respective substrate connection terminal of the plurality of substrate connection terminals has a maximum at a center of each respective substrate connection terminal of the plurality of substrate connection terminals.

13. A semiconductor package, comprising a first semiconductor package and a second semiconductor package, wherein the first semiconductor package includes:

a first substrate including a first region and a second region that is horizontally spaced apart from the first region;

a first semiconductor chip mounted on the first region of the first substrate;

a plurality of connection terminals between the first substrate and the first semiconductor chip; and a molding layer on the first substrate and the first semiconductor chip, wherein the second semiconductor package includes:

a plurality of substrate connection terminals on the second region of the first substrate;

a second substrate on the plurality of substrate connection terminals; and a second semiconductor chip on the second substrate, wherein the molding layer comprises a plurality of recesses that are arranged in a two-dimensional array on the second region of the first substrate, wherein the plurality of substrate connection terminals are in respective ones of the plurality of recesses and electrically connect the first semiconductor package to the second semiconductor package, wherein the second semiconductor chip is spaced apart in a horizontal direction from the first semiconductor chip, wherein the molding layer contacts a top surface of the first semiconductor chip and is arranged under a bottom surface of the second semiconductor chip, wherein the molding layer comprises:

a first portion outside of the plurality of recesses that is adjacent to and laterally offset from the second semiconductor chip; and a second portion between the plurality of recesses, and wherein a thickness of the first portion is equal to a thickness of the second portion.

14. The semiconductor package of claim 13, wherein the molding layer is spaced apart from the second semiconductor package.

15. The semiconductor package of claim 13, further comprising an underfill layer between the first substrate and the first semiconductor chip, the underfill layer on side surfaces of the plurality of connection terminals between the first substrate and the first semiconductor chip.

16. The semiconductor package of claim 13, further comprising a plurality of external connection terminals on a bottom surface of the first substrate.

* * * * *